(12) United States Patent
Suryanarayana et al.

(10) Patent No.: US 7,659,768 B2
(45) Date of Patent: Feb. 9, 2010

(54) REDUCED LEAKAGE VOLTAGE LEVEL SHIFTING CIRCUIT

(75) Inventors: Samu Suryanarayana, Sunnyvale, CA (US); Arvind Bomdica, Fremont, CA (US); Yikai Liang, Fremont, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 12/339,800

(22) Filed: Dec. 19, 2008

(65) Prior Publication Data

US 2009/0167405 A1 Jul. 2, 2009

Related U.S. Application Data

(60) Provisional application No. 61/017,317, filed on Dec. 28, 2007.

(51) Int. Cl.
*H03L 5/00* (2006.01)
(52) U.S. Cl. .................................... 327/333; 326/81
(58) Field of Classification Search ................. 327/333; 326/62, 63, 68, 80, 81
See application file for complete search history.

(56) References Cited

U.S. PATENT DOCUMENTS

| | | | |
|---|---|---|---|
| 4,045,691 A | | 8/1977 | Asano |
| 5,241,225 A | * | 8/1993 | Okajima et al. ............... 326/73 |
| 5,399,920 A | * | 3/1995 | Van Tran ...................... 326/83 |
| 5,659,258 A | * | 8/1997 | Tanabe et al. ................. 326/68 |
| 6,043,699 A | * | 3/2000 | Shimizu ...................... 327/333 |
| 6,342,996 B1 | | 1/2002 | Drapkin et al. |
| 6,480,050 B1 | * | 11/2002 | Barnes ....................... 327/333 |
| 6,515,521 B2 | * | 2/2003 | Kono et al. .................. 327/108 |
| 6,566,930 B1 | * | 5/2003 | Sato ........................... 327/333 |
| 6,661,274 B1 | * | 12/2003 | Naka et al. .................. 327/333 |
| 7,034,573 B1 | * | 4/2006 | Chang ......................... 326/68 |
| 7,248,075 B2 | * | 7/2007 | Min et al. ...................... 326/80 |
| 7,248,243 B2 | | 7/2007 | Murakami et al. |
| 7,292,494 B2 | | 11/2007 | Hsu et al. |
| 7,317,335 B2 | * | 1/2008 | Min et al. ...................... 326/81 |
| 7,375,574 B2 | * | 5/2008 | Kanno et al. ................ 327/333 |
| 7,456,654 B1 | * | 11/2008 | Rau et al. ...................... 326/81 |
| 7,474,127 B2 | * | 1/2009 | Mohanavelu ................ 326/127 |
| 2006/0028245 A1 | * | 2/2006 | Min et al. ...................... 326/81 |
| 2006/0033530 A1 | * | 2/2006 | Seo ............................. 326/81 |
| 2006/0290404 A1 | * | 12/2006 | Law ........................... 327/333 |

\* cited by examiner

*Primary Examiner*—Lincoln Donovan
*Assistant Examiner*—William Hernandez
(74) *Attorney, Agent, or Firm*—Vedder Price P.C.

(57) ABSTRACT

A level shifting circuit includes a first stage and a second stage. The first stage and second stage are operatively coupled to a first and second power supply. The first stage translates a differential input voltage into an intermediate differential voltage. The second stage translates the intermediate differential voltage into a differential output voltage and provides feedback to the first stage in response to translating the intermediate differential voltage. The first stage reduces current flow between the first and second power supply through the second stage in response to the feedback.

24 Claims, 4 Drawing Sheets

# REDUCED LEAKAGE VOLTAGE LEVEL SHIFTING CIRCUIT

CROSS-REFERENCE TO RELATED APPLICATION

This application claims the benefit of U.S. Provisional Application No. 61/017,317, filed on Dec. 28, 2007. The disclosure of the above application is incorporated herein by reference in its entirety.

FIELD

The present disclosure generally relates to voltage level shifting circuits, and more particularly, reducing leakage current thereby reducing power consumption of voltage level shifting circuits.

BACKGROUND

Many modern systems include multiple circuits that interact with each other. Some circuits operate at a low voltage level in order to reduce power consumption. However, many systems also have circuits that operate at a higher voltage level. Level shifting circuits are generally interposed between circuits operating at different voltage levels in order to facilitate communication. For example, a leveling shifting circuit can be employed for transferring a signal generated by a circuit having a low voltage level to a circuit having a higher voltage level and vice versa.

Conventional level shifting circuits tend to leak current between reference voltages. This leakage current increases power consumption of the circuit, which is undesirable.

It is therefore desirable, among other things, to provide a level shifting circuit that reduces leakage current between references voltages and thus consumes less power than conventional level shifting circuits.

BRIEF DESCRIPTION OF THE DRAWINGS

The invention will be more readily understood in view of the following description when accompanied by the below figures, wherein like reference numerals represent like elements.

DETAILED DESCRIPTION

Figure 1:
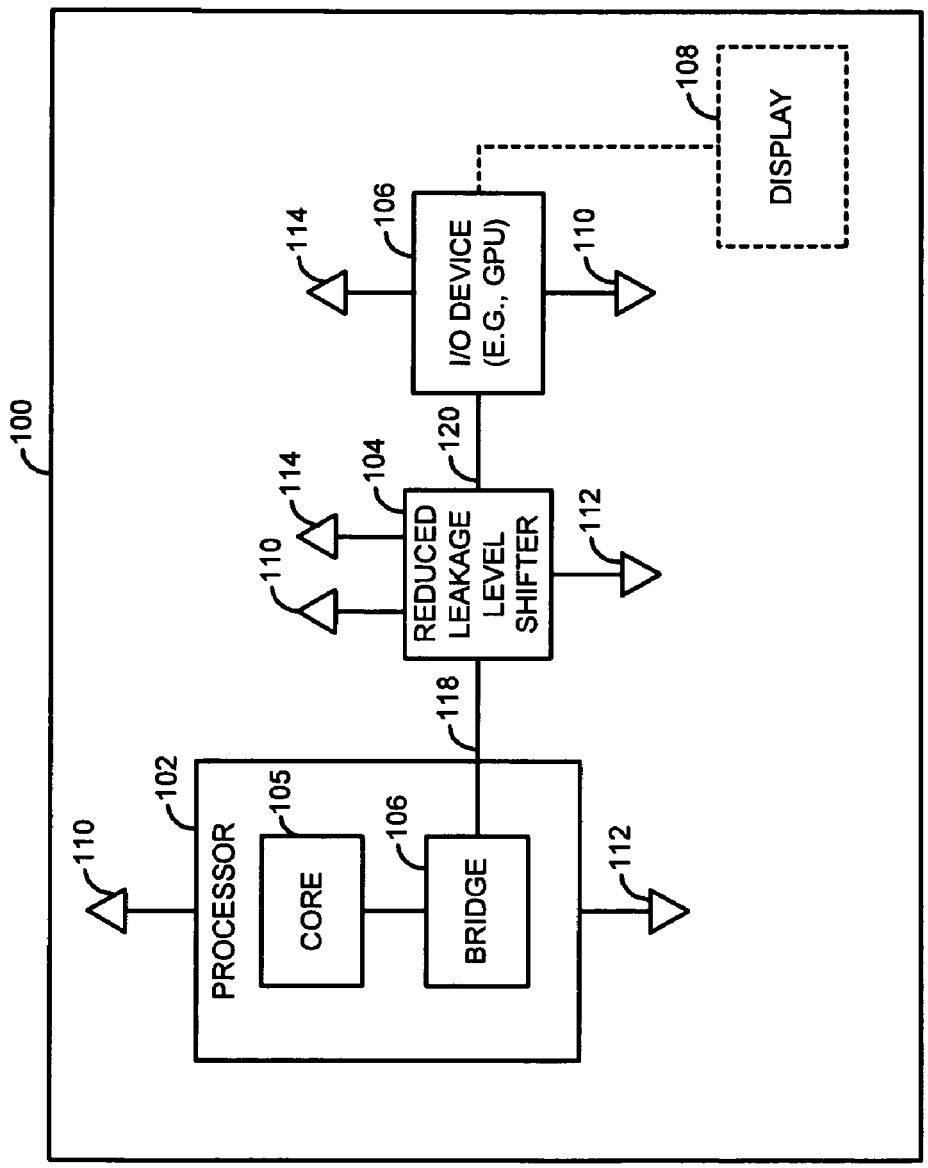
FIG. 1 is a functional block diagram of one example of a device that includes a voltage level shifting circuit according to the present disclosure.

In one example, a level shifting circuit includes a first stage and a second stage. The first stage and second stage are operatively coupled to a first and second power supply. The first stage translates a differential input voltage into an intermediate differential voltage. The second stage translates the intermediate differential voltage into a differential output voltage and provides feedback to the first stage in response to translating the intermediate differential voltage. The first stage reduces current flow between the first and second power supply through the second stage in response to the feedback. A related method is also disclosed.

The circuit and method provide, among other advantages, reduced leakage current between the first and second power supply. By reducing (or in some cases essentially eliminating) leakage current between the first and second power supplies, power consumption of the circuit is reduced. Other advantages will be recognized by those of ordinary skill in the art.

In one example, the differential input voltage is based on an input signal and the first stage translates the differential input voltage into the intermediate differential voltage by shifting a logical high of the input signal based on the first power supply. In one example, the second stage translates the intermediate input voltage into the output differential voltage by shifting a logical low of the input signal based on the second power supply.

In one example, the level shifting circuit includes an input stage operatively coupled to the second power supply and a third power supply. The input stage provides the differential input voltage based on the second and third power supply in response to an input signal.

In one example, the first power supply provides a first voltage. The second power supplies a second voltage less than the first voltage. The third power supply provides a third voltage less than the second voltage.

In one example, the level shifting circuit includes an output stage operatively coupled to the first and second power supply. The output stage buffers the differential output voltage and provides an output signal based on the differential output voltage.

In one example, the first stage includes a first transistor, a second transistor, a third transistor, a fourth transistor, a fifth transistor, and a sixth transistor. The first transistor includes a first source terminal, a first gate terminal, and a first drain terminal. The second transistor includes a second source terminal, a second gate terminal, and a second drain terminal. The third transistor includes a third source terminal, a third gate terminal, and a third drain terminal. The fourth transistor includes a fourth source terminal, a fourth gate terminal, and a fourth drain terminal. The fifth transistor includes a fifth source terminal, a fifth gate terminal, and a fifth drain terminal. The sixth transistor includes a sixth source terminal, a sixth gate terminal, and a sixth drain terminal. The first and fourth source terminals are operatively coupled to the first power supply. The first drain terminal is operatively coupled to the second source terminal. The third drain terminal is operatively coupled to the second drain terminal. The third source terminal is operative to receive a first input voltage of the differential input voltage. The fourth drain terminal is operatively coupled to the fifth source terminal. The sixth drain terminal is operatively coupled to the fifth drain terminal. The sixth source terminal is operative to receive a second input voltage of the differential input voltage. The second and third gate terminals are operatively coupled to the first power supply. The fifth and sixth gate terminals are operatively coupled to the second power supply. The first gate terminal is operative to receive the feedback from the second stage. The fourth gate terminal is operative to receive the feedback from the second stage.

In one example, either the first or fourth transistor is enabled to allow current flow in response to the feedback. In one example, the first transistor is disabled to allow currently flow when the fourth transistor is enabled to allow current flow and the fourth transistor is disabled to allow currently flow when the first transistor is enabled to allow current flow.

In one example the second stage includes a first transistor, a second transistor, a third transistor, and a fourth transistor. The first transistor includes a first source terminal, a first gate terminal, and a first drain terminal. The second transistor includes a second source terminal, a second gate terminal, and a second drain terminal. The third transistor includes a third source terminal, a third gate terminal, and a third drain terminal. The fourth transistor includes a fourth source terminal, a fourth gate terminal, and a fourth drain terminal. The first and third source terminals are operatively coupled to the first voltage source. The first drain terminal is operatively coupled to the second source terminal.

In one example, the first stage includes a first and second switch operatively coupled to the first power supply. The second stage provides feedback to the first and second switches in response to translating the intermediate differential voltage. The second stage includes a third and fourth switch arranged in series between the first and second power supply and a fifth and sixth switch arranged in series between the first and second power supply. The first stage is operative to reduce current flow between the first and second power supply through the second stage by enabling either the first or second switch in response to the feedback and enabling either the third or sixth switch and either the fourth or fifth switch in response to enabling either the first or second switch. In one example, the first, second, third, fourth, fifth and sixth switches are metal oxide semiconductor field effect transistors.

In one example, a device includes a first processor, a second processor, and the level shifting circuit. The first processor is operatively coupled to the first and second power supply. The second processor is operatively coupled to the second and third power supply. The level shifting circuit is operatively coupled between the first and second processor. In one example, the first processor is a central processor and the second processor is a graphics processor.

In one example, a computer readable medium includes information that when executed by at least one processor causes the processor to operate, design, and/or organize the level shifting circuit. In one example, the information includes data representing hardware description language.

As used herein, the term "circuit" and/or "stage" can include an electronic circuit, one or more processors (e.g., shared, dedicated, or group of processors such as but not limited to microprocessors, DSPs, or central processing units), and memory that execute one or more software or firmware programs, combinational logic circuits, an ASIC, and/or other suitable components that provide the described functionality. Additionally, as will be appreciated by those of ordinary skill in the art, the operation, design, and organization, of a "circuit" and/or "stage" can be described in a hardware description language such as Verilog™, VHDL, or other suitable hardware description languages.

Referring now to FIG. 1, a functional block diagram of a device 100 such as a wireless phone, printer, television, a mobile and/or stationary computer, a printer, a LAN interface (wireless and/or wired), a media player, a video decoder and/or encoder, and/or any other suitable digital device is depicted. The device 100 includes at least one processor 102, a reduced leakage voltage level shifting circuit 104, and a high speed I/O device 106 such as a graphics processor (or core) and associated display 108. In some embodiments, the processor 102 includes at least one processing core 105 and a bridge circuit 106. In other embodiments, the bridge circuit 106 can be external to the processor 102.

In this example, the processor 102 operates at a different voltage level than the I/O device 106. As such, the processor 102 is operatively coupled to a first power supply 110 and a second power supply 112. In some embodiments, the first power supply 110 can provide, for example, 1.8 Volts and the second power supply 112 can provide, for example, 0 Volts (e.g., ground) although other values are contemplated.

The I/O device 106 is operatively coupled to a third power supply 114 and the first power supply 110. In some embodiments, the third power supply 114 can provide, for example, 3.3 Volts and the first power supply 110 can provide, for example, 1.8 Volts although other values are contemplated.

The processor 102 and the I/O device 106 communicate via the reduced leakage voltage level shifting circuit 104. For example, when the processor 102 communicates a first differential voltage signal 118 having a signal swing between the first and second power supply 110, 112 voltage levels, the voltage level shifting circuit 104 translates the signal 118 into a second differential voltage signal 120 having a signal swing between the third and first power supply 114, 110 voltage levels. Likewise, when the I/O device 106 communicates the second differential voltage signal 120 having a signal swing between the first and third power supply 110, 114 voltage levels, the voltage level shifting circuit 104 translates the signal 120 into the first differential voltage signal 118 having a signal swing between the first and second power supply 110, 112 voltage levels.

Figure 2:
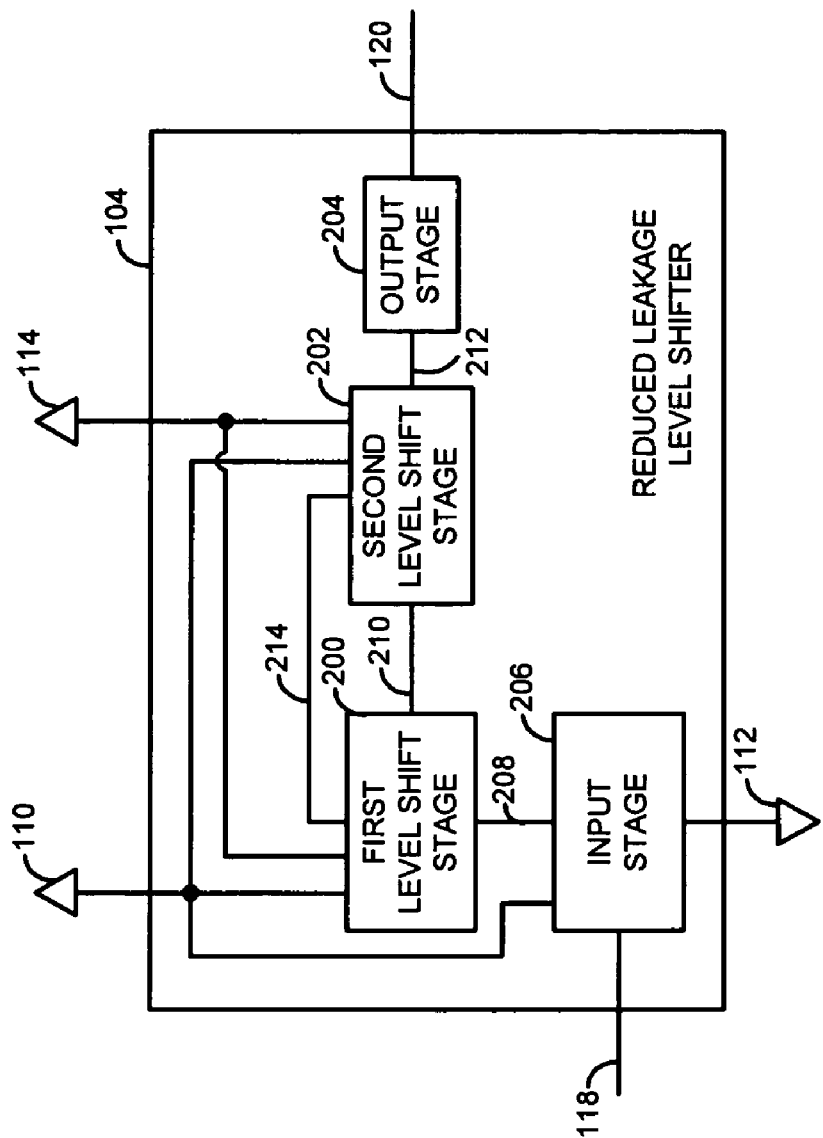
FIG. 2 is a functional block diagram of one example of the voltage level shifting circuit.

Referring now to FIG. 2, the reduced leakage voltage level shifting circuit 104 includes a first level shifting stage 200, a second level shifting stage 202, a output stage 204, and an input stage 206. The input stage 206 is operatively coupled to the first power supply 110, the second power supply 112, and the first level shifting stage 200. The first level shifting stage 200 is operatively coupled to the first power supply 110, the third power supply 114, the input stage 206, and the second level shifting stage 202. The second level shifting stage 202 is operatively coupled to the first power supply 110, the third power supply 114, the first level shifting stage 200, and the output stage 204.

The input stage 206 provides a differential input voltage signal 208 in response to the differential voltage signal 118. In some embodiments, the differential input voltage 208 is based on the first and second power supply 110, 112 and has a signal swing between the first power supply 110 voltage level and the second power supply 112 voltage level.

The first level shifting stage 200 translates the differential input voltage signal 208 into an intermediate differential voltage signal 210. In some embodiments, the intermediate differential voltage signal 208 has a signal swing between the second power supply 112 voltage level and the third power supply 114 voltage level. In this embodiment, the first level shifting stage 200 translates the differential input voltage signal 208 into the intermediate differential voltage signal 210 by shifting a logical high of the differential input voltage signal 208 based on the third power supply 114. For example, if a logical high of the differential input voltage signal 208 is represented by 1.8 Volts (e.g., from the first power supply 110), the first level shifting stage 200 shifts the logical high to 3.3 Volts (e.g., from the third power supply 114).

The second level shifting stage 202 translates the intermediate differential voltage signal 210 into a differential output voltage signal 212. The output stage 204 buffers the differential output voltage signal 212 and provides the second differential voltage signal 120 based thereon.

In some embodiments, the differential output signal 212 has a signal swing between the first power supply 110 voltage level and the third power supply 114 voltage level. In this embodiment, the second level shifting stage 202 translates the intermediate differential voltage signal 210 into the differential output voltage signal 212 by shifting a logical low of the intermediate differential voltage signal 210 based on the first power supply 110. For example, if a logical low of the intermediate differential input voltage signal 210 is represented by 0 Volts (e.g., from the second power supply 112), the second level shifting stage 202 shifts the logical low to 1.8. Volts (e.g., from the first power supply 110).

In addition, the second level shifting stage provides feedback 214 to the first level shifting stage 200 in response to translating the intermediate differential voltage signal 210. In response to the feedback 214, the first level shifting stage 200 reduces current flow between the first power supply 110 and the third power supply 114. In this manner, leakage current between the first power supply 110 and the third power supply 114 is reduced (or in some cases essentially eliminated), which in turn reduces power consumption of the voltage level shifting circuit 104.

Figure 3:
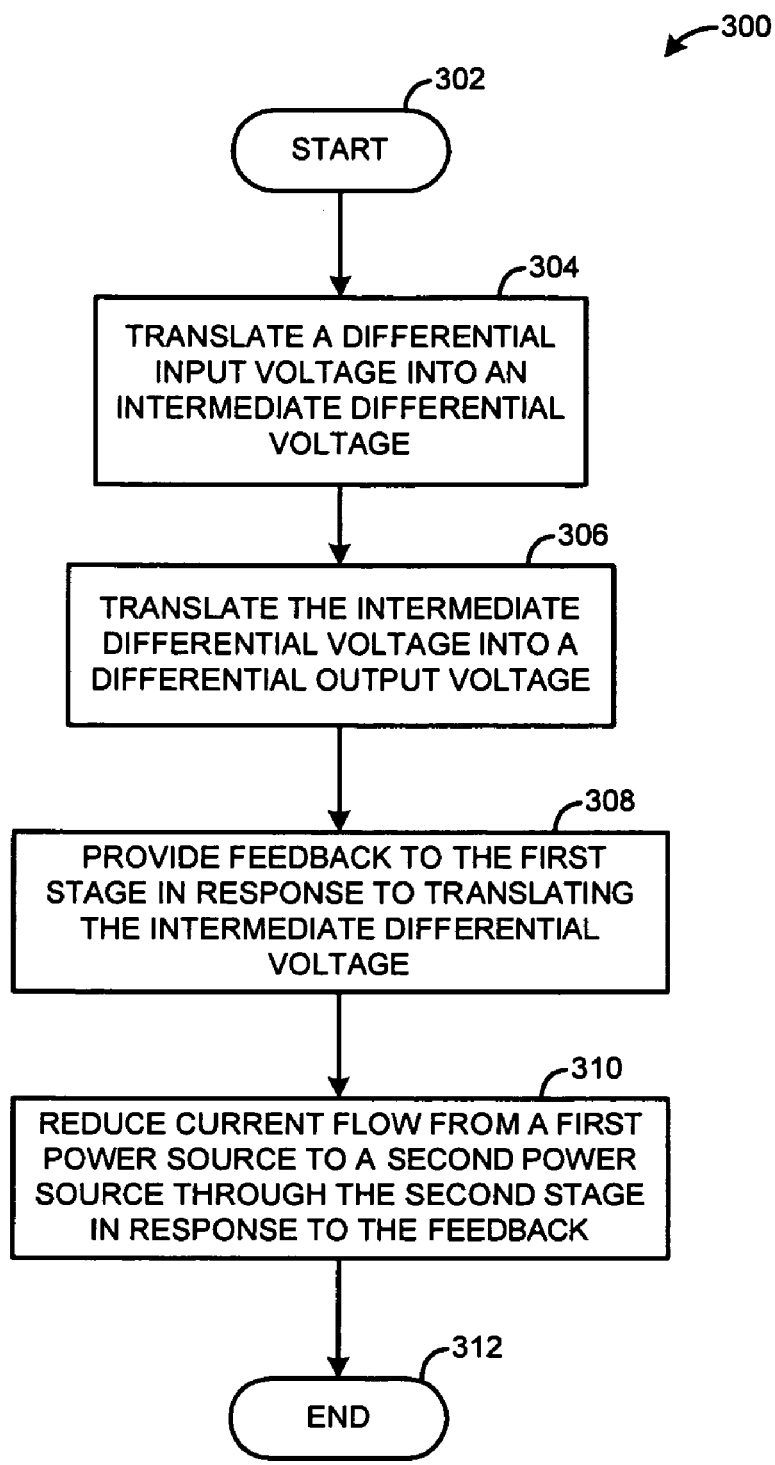
FIG. 3 is a flowchart depicting exemplary steps that can be taken by the voltage level shifting circuit.

Referring now to FIG. 3, exemplary steps that can be taken by the reduced leakage voltage level shifting circuit 104 are generally identified at 300. The process starts in step 302 when the voltage level shifting circuit 104 receives the differential voltage signal 118. In step 304, the first level shifting stage 200 translates the differential voltage 118 into the intermediate differential voltage signal 210. In step 306, the second level shifting stage 202 translates the intermediate differential voltage signal 210 into the differential output voltage signal 212. In step 308, the second level shifting stage 202 provides feedback 214 to the first level shifting stage 200 in response to translating the intermediate differential voltage signal 210. In step 310, the first level shifting stage 200 reduces current flow between the third power supply 114 and the first power supply 110 though the first level shifting stage 200. The process ends in step 312.

Figure 4:
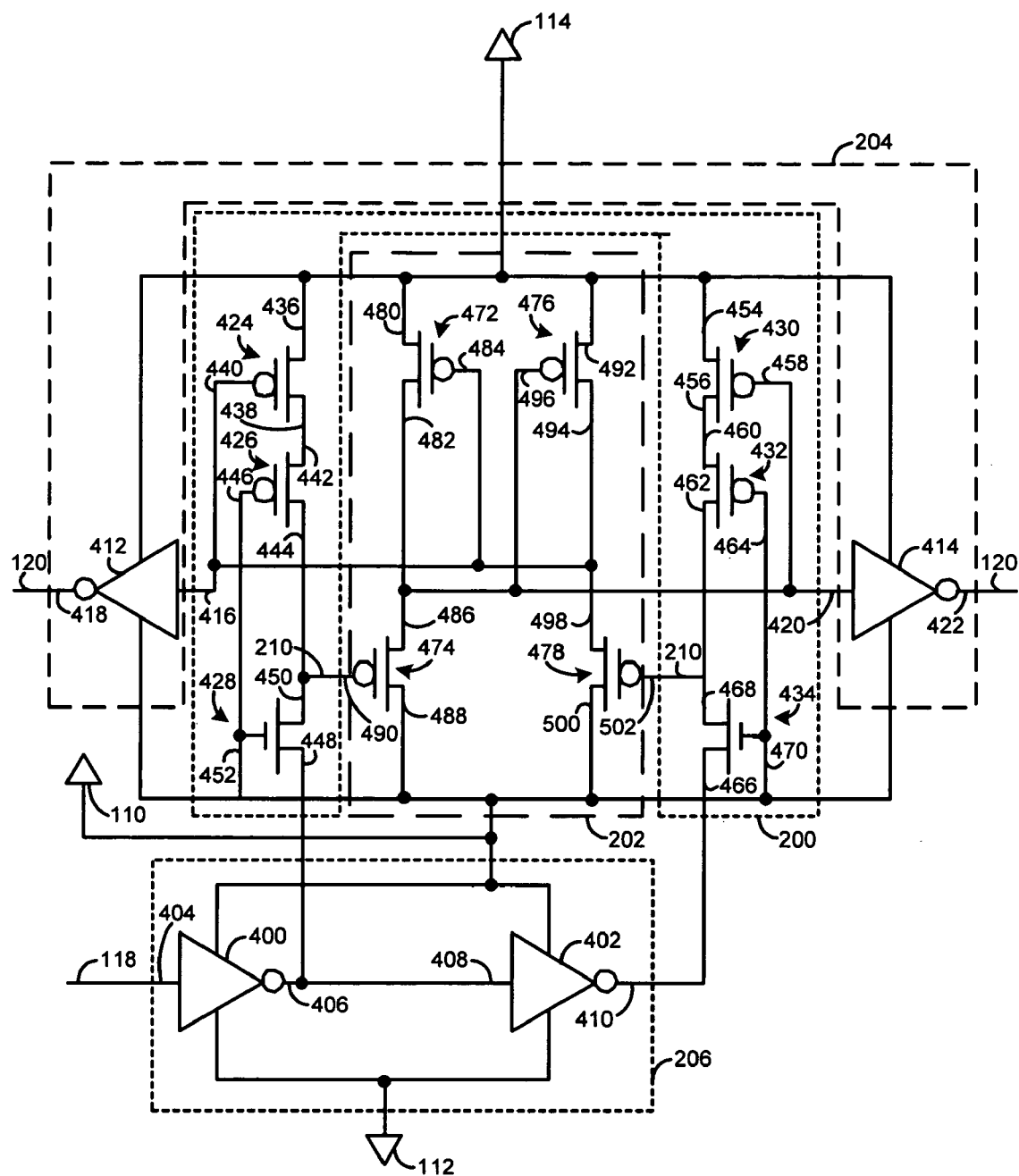
FIG. 4 is an exemplary circuit diagram of the voltage level shifting circuit.

Referring now to FIG. 4, an exemplary diagram of the reduced leakage voltage level shifting circuit 104 is depicted. The input stage 206 includes a first inverter circuit 400 and a second inverter circuit 402. The first and second inverter circuits 400, 402 are operatively coupled to the first and second power supplies 110, 112.

The first inverter circuit 400 includes a first inverter input terminal 404 and a first inverter output terminal 406. The second inverter circuit 402 includes a second inverter input terminal 408 and a second inverter output terminal 410. The first inverter output terminal 406 is operatively coupled to the second inverter input terminal 408 and the first level shifting stage 200. The second inverter output terminal 410 is operatively coupled to the first level shifting stage 200.

The output stage 204 includes a first inverter circuit 412 and a second inverter circuit 414. The first and second inverter circuits 412, 414 are operatively coupled to the first and third power supplies 110, 114. The first inverter circuit 412 includes a first inverter input terminal 416 and a first inverter output terminal 418. The second inverter circuit 414 includes a second inverter input terminal 420 and a second output inverter terminal 422. The first and second inverter input terminals 416, 418 are operatively coupled the first level shifting stage 200. During operation, the output stage 204 buffers the differential output voltage signal 212 received via terminals 416 and 420 and provides the second differential voltage signal 120 via terminals 418 and 422.

The first level shifting stage 200 includes a first transistor 424, a second transistor 426, a third transistor 428, a fourth transistor 430, a fifth transistor 432, and a sixth transistor 434. The transistors 424, 426, 428, 430, 432, 434 essentially operate as switches and are turned on (or enabled) and turned off (or disabled). In this example, the first transistor 424, second transistor 426, fourth transistor 430, and fifth transistor 432 are p-channel metal oxide semiconductor field effect (PMOS) transistors although other transistors can be used in accordance with the present disclosure. In addition, in this example, the third transistor 428 and sixth transistor 434 are n-channel metal oxide semiconductor field effect (NMOS) transistors although other transistors can be used in accordance with the present disclosure.

The first transistor 424 includes a first source terminal 436, a first drain terminal 438, and a first gate terminal 440. The second transistor 426 includes a second source terminal 442, a second drain terminal 444, and a second gate terminal 446. The third transistor 428 includes a third source terminal 448, a third drain terminal 450, and a third gate terminal 452. The fourth transistor 430 includes a fourth source terminal 454, a fourth drain terminal 456, and a fourth gate terminal 458. The fifth transistor 432 includes a fifth source terminal 460, a fifth drain terminal 462, and a fifth gate terminal 464. The sixth terminal 434 includes a sixth source terminal 466, a sixth drain terminal 468, and a sixth gate terminal 470.

The first source terminal 436 and the fourth source terminal 454 are operatively coupled to the third power supply 114. The first drain terminal 438 is operatively coupled to the second source terminal 442. The second drain terminal 444 is operatively coupled to the third drain terminal 450, and the second level shifting stage 202. The third source terminal 448 is operatively coupled to the first inverter output terminal 406. The second gate terminal 446 and the third gate terminal 452 are operatively coupled to the first power supply 110. The first gate terminal 440 is operatively coupled to the first inverter input terminal 416.

The fourth drain terminal 456 is operatively coupled to the fifth source terminal 460. The fifth drain terminal 462 is operatively coupled to the sixth drain terminal 468 and the second level shifting circuit 202. The sixth source terminal 466 is operatively coupled to the second inverter output terminal 410. The fifth gate terminal 464 and sixth gate terminal 470 are operatively coupled to the first power supply 110. The fourth gate terminal 458 is operatively coupled to the second inverter input terminal 420.

The second level shifting circuit 202 includes a seventh transistor 472, an eighth transistor 474, a ninth transistor 476, and a tenth transistor 478. The transistors 472, 474, 476, 478 essentially operate as switches and are turned on (or enabled) and turned off (or disabled). In this example, the seventh transistor 472, the eighth transistor 474, the ninth transistor 476, and the tenth transistor 478 are PMOS transistors although other transistors are contemplated.

The seventh transistor 472 includes a seventh source terminal 480, a seventh drain terminal 482, and a seventh gate terminal 484. The eighth transistor 474 includes an eighth source terminal 486, an eighth drain terminal 488, and an eighth gate terminal 490. The ninth transistor 476 includes a ninth source terminal 492, a ninth drain terminal 494, and a ninth gate terminal 496. The tenth transistor 478 includes a tenth source terminal 498, a tenth drain terminal 500, and a tenth gate terminal 502.

The seventh source terminal 480 and ninth source terminal 492 are operatively coupled to the third power supply 114. The eighth drain terminal 488 and tenth drain terminal 500 are operatively coupled to the first power supply 110. The eighth source terminal 486 and ninth gate terminal 496 are operatively coupled to the second inverter input terminal 420. The tenth source terminal 498 and the seventh gate terminal 484 are operatively coupled to the first inverter input terminal 416.

During operation, the input stage 206 provides the differential input voltage signal 208 via terminals 406 and 410 in response to the differential voltage signal 118. The first level shifting circuit 200 translates the differential input voltage signal 208 into the intermediate differential voltage signal 210 based on the first power supply 110 and the third power supply 114. More specifically, when the second inverter output terminal 410 has a voltage approximately equal to the second power supply 112, the tenth transistor 478 turns on, which provides the feedback 214 to the first level shifting stage 200 via the first gate terminal 440. In response to the feedback, the first transistor 424 and turns on. The first transistor 424 pulls the voltage at the eighth gate terminal 450 to the third power supply 114 voltage level, which turns off the eight transistor 474. In addition, the seventh transistor 472 turns on, which pulls the voltage at the ninth gate terminal 496 to the third power supply 114 voltage level, which turns off the ninth transistor 476. Accordingly, turning off both the eighth transistor 474 and ninth transistor 476 creates an open circuit between the third power supply 114 and the first power supply 110, which reduces (and in some cases prevents) leakage current from flowing between the third power supply 114 and the first power supply 110.

When the second inverter output terminal 406 has a voltage approximately equal to the second power supply 112, the third transistor 428 turns on which turns on the eighth transistor 474 and provides the feedback 214 to the first level shifting stage 200 via the fourth gate terminal 458. In response to the feedback, the fourth transistor 430 and turns on. The fourth transistor 430 pulls the voltage at the tenth gate terminal 502 to the third power supply 114 voltage level, which turns off the tenth transistor 478. In addition, the ninth transistor 476 turns on, which pulls the voltage at the seventh gate terminal 484 to the third power supply 114 voltage level, which turns off the seventh transistor 472. Accordingly, turning off both the seventh transistor 472 and tenth transistor 478 creates an open circuit between the third power supply 114 and the first power supply 110, which reduces (and in some cases essentially prevents) leakage current from flowing between the third power supply 114 and the first power supply 110.

As noted above, among other advantages, the voltage level shifting circuit 104 creates an open circuit between the first power supply 110 and the third power supply 114, which reduces (or in some cases essentially eliminates) leakage current between the first power supply 110 and third power supply 114. By reducing leakage current between the first and third power supplies 110, 114, power consumption of the voltage level circuit 104 is reduced. Other advantages will be recognized by those of ordinary skill in the art.

Also, integrated circuit design systems (e.g., work stations) are known that create integrated circuits based on executable information stored on a computer readable memory such as but not limited to CDROM, RAM, other forms of ROM, hard drives, distributed memory etc. The information may include data representing (e.g., compiled or otherwise represented) any suitable language such as, but not limited to, hardware descriptor language or other suitable language. As such, the "stages" and/or "circuits" described herein may also be produced as integrated circuits by such systems. For example an integrated circuit may be created for use in a display using information stored on a computer readable medium that when executed cause the integrated circuit design system to create an integrated circuit that includes a first stage and a second stage. The first stage and second stage are operatively coupled to a first and second power supply. The first stage translates a differential input voltage into an intermediate differential voltage. The second stage translates the intermediate differential voltage into a differential output voltage and provides feedback to the first stage in response to translating the intermediate differential voltage. The first stage reduces current flow between the first and second power supply through the second stage in response to the feedback. Integrated circuits having the "stages" and/or "circuit" that performs other operations described herein may also be suitable produced.

While this disclosure includes particular examples, it is to be understood that the disclosure is not so limited. Numerous modifications, changes, variations, substitutions, and equivalents will occur to those skilled in the art without departing from the spirit and scope of the present disclosure upon a study of the drawings, the specification, and the following claims.

What is claimed is:

1. A level shifting circuit, comprising:
   a first stage, operatively coupled to a first and second power supply, that is operative to translate a differential input voltage into an intermediate differential voltage; and
   a second stage, operatively coupled to the first and second power supply, that is operative to translate the intermediate differential voltage into a differential output voltage and to provide feedback to the first stage in response to translating the intermediate differential voltage, wherein the first stage is operative to reduce current flow between the first and second power supply through the second stage in response to the feedback.

2. The level shifting circuit of claim 1 wherein the differential input voltage is based on an input signal and wherein the first stage translates the differential input voltage into the intermediate differential voltage by shifting a logical high of the input signal based on the first power supply.

3. The level shifting circuit of claim 1 wherein the differential input voltage is based on an input signal and wherein the second stage translates the intermediate input voltage into the output differential voltage by shifting a logical low of the input signal based on the second power supply.

4. The level shifting circuit of claim 1 further comprising an input stage, operatively coupled to the second power supply and a third power supply, that is operative to provide the differential input voltage based on the second and third power supply in response to an input signal.

5. The level shifting circuit of claim 2 wherein the first power supply provides a first voltage, the second power supplies a second voltage less than the first voltage, and the third power supply provides a third voltage less than the second voltage.

6. The level shifting circuit of claim 1 further comprising an output stage, operatively coupled to the first and second power supply, that is operative to buffer the differential output voltage and to provide an output signal based on the differential output voltage.

7. The level shifting circuit of claim 1 wherein the first stage comprises:
   a first transistor having a first source terminal, a first gate terminal, and a first drain terminal;
   a second transistor having a second source terminal, a second gate terminal, and a second drain terminal;
   a third transistor having a third source terminal, a third gate terminal, and a third drain terminal;
   a fourth transistor having a fourth source terminal, a fourth gate terminal, and a fourth drain terminal;
   a fifth transistor having a fifth source terminal, a fifth gate terminal, and a fifth drain terminal; and
   a sixth transistor having a sixth source terminal, a sixth gate terminal, and a sixth drain terminal, wherein:
   the first and fourth source terminals are operatively coupled to the first power supply;
   the first drain terminal is operatively coupled to the second source terminal;
   the third drain terminal is operatively coupled to the second drain terminal;

the third source terminal is operative to receive a first input voltage of the differential input voltage;

the fourth drain terminal is operatively coupled to the fifth source terminal;

the sixth drain terminal is operatively coupled to the fifth drain terminal;

the sixth source terminal is operative to receive a second input voltage of the differential input voltage;

the second and third gate terminals are operatively coupled to the first power supply;

the fifth and sixth gate terminals are operatively coupled to the second power supply;

the first gate terminal is operative to receive the feedback from the second stage; and the fourth gate terminal is operative to receive the feedback from the second stage.

8. The level shifting circuit of claim 7 wherein one of the first and fourth transistors is enabled to allow current flow in response to the feedback.

9. The level shifting circuit of claim 8 wherein the first transistor is disabled to allow currently flow when the fourth transistor is enabled to allow current flow and wherein the fourth transistor is disabled to allow currently flow when the first transistor is enabled to allow current flow.

10. The level shifting circuit of claim 7 wherein the first, second, fourth, and fifth transistors are p-channel metal oxide semiconductor field effect transistors.

11. The level shifting circuit of claim 7 wherein the third and sixth transistors are n-channel metal oxide semiconductor field effect transistors.

12. The level shifting circuit of claim 1 wherein the second stage comprises:
a first transistor having a first source terminal, a first gate terminal, and a first drain terminal;
a second transistor having a second source terminal, a second gate terminal, and a second drain terminal;
a third transistor having a third source terminal, a third gate terminal, and a third drain terminal;
a fourth transistor having a fourth source terminal, a fourth gate terminal, and a fourth drain terminal; wherein:
the first and third source terminals are operatively coupled to the first voltage source;
the first drain terminal is operatively coupled to the second source terminal.

13. A level shifting circuit, comprising:
a first stage, operatively coupled to a first and second power supply, that is operative to translate a differential input voltage into an intermediate differential voltage, wherein the first stage comprises a first and second switch operatively coupled to the first power supply; and
a second stage, operatively coupled to the first and second power supply, that is operative to translate the intermediate differential voltage into a differential output voltage and to provide feedback to the first and second switches in response to translating the intermediate differential voltage, wherein the second stage comprises a third and fourth switch arranged in series between the first and second power supply and a fifth and sixth switch arranged in series between the first and second power supply, wherein the first stage is operative to reduce current flow between the first and second power supply through the second stage by enabling one of the first and second switches in response to the feedback and enabling one of the third and sixth switches and one of the fourth and fifth switches in response to enabling one of the first and second switches.

14. The level shifting circuit of claim 13 wherein the first, second, third, fourth, fifth and sixth switches are metal oxide semiconductor field effect transistors.

15. The level shifting circuit of claim 13 further comprising an input stage, operatively coupled to the second power source and a third power source, that is operative to provide the differential input voltage based on a input signal.

16. The level shifting circuit of claim 13 further comprising an output stage, operatively coupled to the first and second power supply, that is operative to buffer the differential output voltage and to provide an output signal based on the differential output voltage.

17. The level shifting circuit of claim 13 wherein the differential input voltage comprises a first and second voltage, wherein the first voltage is complementary to the second voltage.

18. The level shifting circuit of claim 13 wherein the differential output voltage comprises a first and second voltage, wherein the first voltage is complementary to the second voltage.

19. A method of voltage level shifting, comprising:
translating, with a first stage, a differential input voltage into an intermediate differential voltage;
translating, with a second stage, the intermediate differential voltage into a differential output voltage and providing feedback to the first stage in response to translating the intermediate differential voltage; and
reducing, with the first stage, current flow from a first power source to a second power source through the second stage in response to the feedback.

20. The method of claim 19 further comprising disabling currently flow from the first power source to the second power source by opening at least one switch of the second stage.

21. A device, comprising:
a first processor operatively coupled to a first and second power supply;
a second processor, operatively coupled to the second power supply and a third power supply; and
a level shifting circuit, operatively coupled to the first and second processor, that is operative to provide a level shifted output signal in response to an input signal received from the first processor, wherein the level shifting circuit comprises:
an input stage, operatively coupled to the second and third power supply, that is operative to provide a differential input voltage in response to an input signal received from the first processor;
a first stage, operatively coupled to the first and second power supply, that is operative to translate the differential input voltage into an intermediate differential voltage;
a second stage, operatively coupled to the first and second power supply, that is operative to translate the intermediate differential voltage into a differential output voltage and to provide feedback to the first stage in response to translating the intermediate differential voltage, wherein the first stage is operative to reduce current flow between the first and second power supply through the second stage in response to the feedback; and
an output stage, operatively coupled to the first and second power supply, that is operative to provide the level shifted output signal to the second processor in response to the differential output voltage.

22. The device of claim 21 wherein the first processor is a central processor and the second processor is a graphics processor.

23. A computer readable medium comprising information that when executed by at least one processor causes the at least one processor to:

at least one of: operate, design, and organize a circuit that comprises:

a first stage, operatively coupled to a first and second power supply, that is operative to translate a differential input voltage into an intermediate differential voltage; and a second stage, operatively coupled to the first and second power supply, that is operative to translate the intermediate differential voltage into a differential output voltage and to provide feedback to the first stage in response to translating the intermediate differential voltage, wherein the first stage is operative to reduce current flow between the first and second power supply through the second stage in response to the feedback.

24. The computer readable medium of claim 23 wherein the information comprises data representing hardware description language.

* * * * *